United States Patent [19]

Chen

[11] Patent Number: 4,473,902
[45] Date of Patent: Sep. 25, 1984

[54] ERROR CORRECTING CODE PROCESSING SYSTEM

[75] Inventor: Chungho Chen, Dresher, Pa.
[73] Assignee: Sperrt Corporation, New York, N.Y.
[21] Appl. No.: 370,766
[22] Filed: Apr. 22, 1982
[51] Int. Cl.³ .............................................. G06F 11/08
[52] U.S. Cl. ....................................... 371/37; 371/40; 371/43; 371/45
[58] Field of Search ....................... 371/30, 37, 39, 40, 371/43, 44, 45, 26

[56] References Cited

U.S. PATENT DOCUMENTS

| | | | |
|---|---|---|---|
| 3,678,469 | 7/1972 | Freeman et al. | 371/37 |
| 4,168,486 | 9/1979 | Legory | 371/37 |
| 4,242,752 | 12/1980 | Herkert | 371/37 |
| 4,354,269 | 10/1982 | Vries et al. | 371/43 |
| 4,395,768 | 7/1983 | Goethals et al. | 371/45 |

OTHER PUBLICATIONS

Parallel-Serial Implementation of Error Correcting Code System, Chen et al., IBM Technical Disclosure, Nov. 1979.
Semi-Parallel Generation of CRC Character, Clough et al., IBM Technical Disclosure, Feb. 1977.
Parallel CRC Generation for Multilength Characters, Boudreau et al., IBM Technical Disclosure, Sep. 1972.
Displacement Calculation of Error Correcting Syndrom Bytes by Table Lookup, Cummins, IBM Technical Disclosure, Jan. 1980.

Primary Examiner—Charles E. Atkinson
Assistant Examiner—Mark Ungerman
Attorney, Agent, or Firm—James R. Bell; Thomas J. Scott; Marshall M. Truex

[57] ABSTRACT

A high speed code processing system for error correcting code is disclosed. It uses bit parallel residue generation for cyclic codes. This minimizes the time delay for cyclic code processing. Residue generation of the bit string is accomplished by processing multiple bits in each clock time instead of the conventional bit-by-bit implementation. Thus, the checkword calculation and the syndrome calculation are accomplished at a significantly higher speed than the conventional shift register approach to provide a system capable of on-line residue generation.

1 Claim, 3 Drawing Figures

ERROR CORRECTING CODE PROCESSING SYSTEM

BACKGROUND OF THE INVENTION

A. Field of the Invention

This invention relates to a system for correcting erroneous data in the memories or data transmission of a data processing system. More particularly, it relates to such an error correcting system which minimizes the time delay for cyclic code processing using a minimum of special hardware.

B. Description of the Prior Art

As memory densities continue to increase so does the risk of errors. Alpha particles and electric noise plague the newer, denser semiconductor memories and surface damage on magnetic disks is becoming more troublesome now that bits are being crammed into smaller areas.

To remedy these problems, more and more manufacturers are adopting error-detection and correction schemes. The grandfather of them all uses the parity bit, which simply records whether the number of binary 1's in one memory location is even or odd and thus detects only single-bit errors. Luckily mathematicians are forever contriving new ways for the engineer to uncover even multiple bit errors.

Hamming codes have proved particularly useful in the semiconductor memory context. They append a fixed number of check bits to each byte or word of data. Upon reading from that location, the check bits will detect and correct all single-bit errors and will flag as impossible to correct all multibit errors.

One of the more advanced systems uses Fire code to protect and correct up to 12 erroneous bits. In this method, the repeated division of a data stream produces a fixed number of check bits that are appended to each disk record. When that same record is read, its check bits are used to detect, locate and correct any error bursts that might be due to imperfections in the disk surface.

The burst-error processor (BEP) is a hardware implementation of these codes. It operates by dividing the data stream, a byte at a time, by a fixed binary number represented mathematically by a polynominal; for example $X^\circ + X^2 + X^5 + X^7$ stands for a binary 10100101 since each exponent indicates the position of a 1.

Even though the data stream is being constantly divided as it passes through the burst-error processor, the actual data remains unaffected. However at the end of the data transmission the internal registers of the processor contain the remainder of the division. For write operations, the remainder bits are appended to the data to produce a disk record. For read operations, the processor continues to divide the check bits after the data has passed to obtain a bit pattern called the syndrome. For error free operation, the syndrome should be 0. If it is not 0, it contains the information about the location of the error burst as well as the position of the errors.

In the error correction mode, the processor uses the syndrome to find first the error location and then the error pattern which is exclusive-OR'd with the error burst to correct it.

Finally, past system implementations almost invariably involved the conventional shift register approach. That is, residue generation of a bit string was accomplished on a bit by bit basis in successive clock cycles.

The foregoing illustrates limitations of the known prior art. Thus, it is apparent that it would be advantageous to provide an alternative directed to overcoming one or more of the limitations as set forth above. Accordingly, a suitable alternative is to provide a high speed code processing for error correcting code.

SUMMARY OF THE INVENTION

In one aspect of the present invention, this is accomplished by providing a high speed code processing system for error correcting code including a clocking device connected to be operative on an encoding/decoding apparatus. Means are provided for supplying a string of information bits to the encoding/decoding apparatus. Also, means are associated with the apparatus for enabling it to encode/decode the information string in multiple bit segments during a single clock time of the clocking device thus reducing the encoding/decoding time.

The foregoing and other aspects will become apparent from the following detailed description of the invention when considered in conjunction with the accompanying drawings. It is to be expressly understood, however; that the drawings are not intended as a definition of the invention but are for the purpose of illustration only.

DETAILED DESCRIPTION OF THE PREFERRED EMBODIMENT

In the conventional method of processing cyclic code, an input I(x) or I(x)+C(x) is fed to a feedback shift register bit-by-bit and a check word C(x) or syndrome S(x) is obtained.

Figure 1:
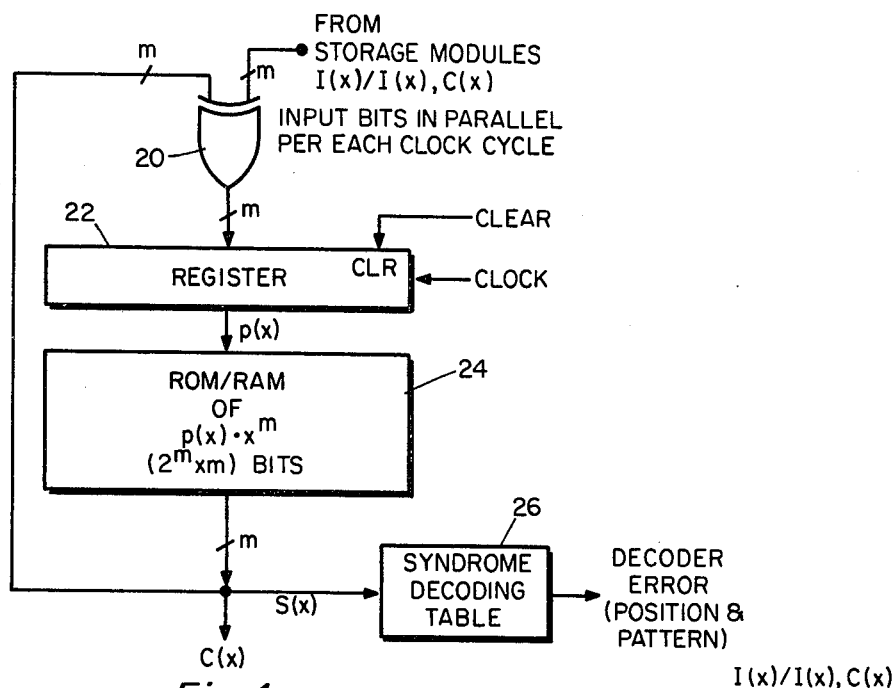
FIG. 1 is a block diagram of the preferred implementation of the present invention where w equals m.

FIG. 1 is a block diagram of the present approach. In this system, the encoding and decoding is done by taking as many bits as desired during each clock cycle. Therefore, there is a reduction in the time required, since the number of clock cycles needed for encoding and decoding is reduced by a factor of w, where w is the number of bits taken in parallel at each clock cycle. While there are many ways of implementing this concept of parallel processing for cyclic codes (from a mathematical viewpoint) it is believed that the table look-up method illustrated in FIG. 1 is the preferred embodiment. It should also be noted that there are two cases for this parallel code implementation. The first is where w (number of bits taken in parallel) is equal to m (the number of check bits).

The second case is where w is not equal to m. The implementation disclosed in FIG. 1 is of the first case where w=m because of the simplicity of illustration. Also, this configuration is of particular use in modular storage units, such as semi-conductor memories, bubble memories and CCD. It requires minimum hardware yet its fast encoding/decoding process allows for online error detection and correction.

Returning to FIG. 1, the logical operation of the system is as follows. First we clear register 22. Next, we load the highest order of m bits from I(x) via the exclusive OR gate 20. We then load the next highest order of m bits from the storage module. Thereafter we clock and load the register 22 at this point, we check to see if this is the end of the storage input step. If not, then we return and load the next highest order of m bits from the storage module. This continues, until we receive the indication that that storage input step is complete. We now read from the ROM/RAM storage table 24 either an output C(x) or an output S(x). An S(x) output is decoded by the Syndrome Decoding Table 26 to provide the position and pattern of the decoded error. As this output is read from the storage table 24, it is recycled, via the exclusive OR gate 20 and the register 22 to the storage table 24.

Figure 2:
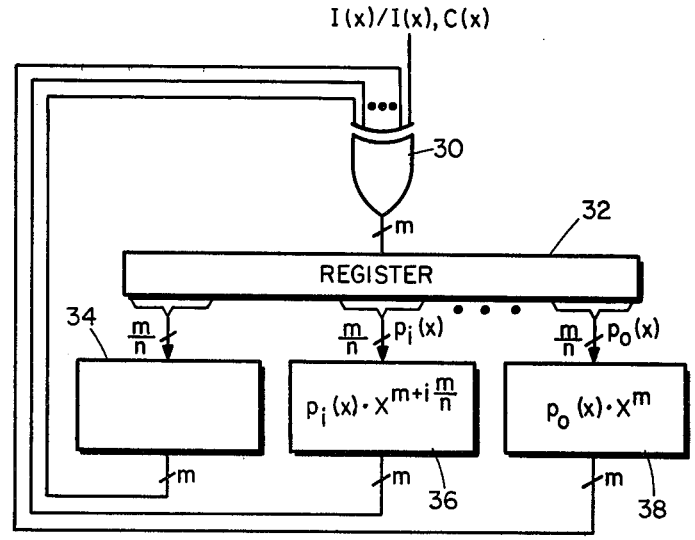
FIG. 2 illustrates the implementation used where m bits is a large number, thereby necessitating the look up table to be prohibitively large.

If m is a large number, the look-up table ROM/RAM24 would become prohibitively large. To accommodate this situation, we disclose the alternate embodiment shown in FIG. 2. In this embodiment, the single look-up table is replaced by a plurality of smaller ones. So instead of the huge look-up table of size ($2^m \times$ m) bits, we propose n tables of size ($2^{m/n} \times$ m) bits or a total of n ($2^{m/n} \times$ m) bits. The operation of the exclusive OR gate 30 and the register 32 is the same as described for FIG. 1. However, there are n tables (34, 36 and 38) of ($2^m \times$ m) bits each.

Figure 3:
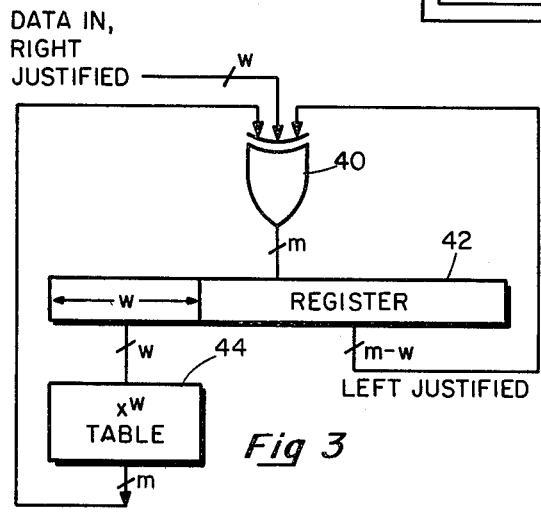
FIG. 3 is a further block diagram of the preferred implementation where m is greater than w.

FIG. 3 illustrates the configuration, where m is larger than w, but where m is an integral multiple of w. If m is not an integral multiple of w, the implementation is slightly more complicated in that the encoding process or checkword calculation requires a separate multiplication of $x^{(m+k_w+1-w)}$ for the last input cycle. Here, we show the exclusive OR gate 40 having three inputs. One for the return cycle previously described, one for right justified Data Input, and one for left justification. The table 44 is of size $2^w$ and it receives w bits from the register 42.

The bit-parallel encoding/decoding algorithm from which this invention has been implemented will now be described to more clearly explain the operation of the preferred embodiment.

For ease in describing the encoding/decoding algorithm, the following nomenclature is defined:
G(x): The code generator polynomial of degree m
I(x): The information polynomial of degree k (i.e., there are k+1 information bits)
C(x): The check polynomial of degree m−1
S(x): The error syndrome
E(x): The last error burst polynomial.

During encoding the check bits are obtained from equation (1) as follows:

$$C(x) = I(x) \cdot x^m \bmod G(x) \quad (1)$$

Equation (2) is then implemented to obtain the error syndrome.

$$S(x) = [I(x)x^m + C(x)]x^m \bmod G(x) \quad (2)$$

In a multi-residue implementation, the encoding process is unchanged, while the decoding process is modified such that one syndrome for each factor of the generator polynomial is obtained.

A complete code processing system consists of the following four functional units:
(a) Encoding (check bit calculation).
(b) Syndrome calculation.
(c) Error decoding from syndrome.
(d) Error correction.

A. Residue calculation

The residue calculation procedure is the most basic operation of the code process. The conventional serial input feedback shift register method is the implementation of the following equation. (e.g., encoding)

$$C(x) = (a_k x^k \oplus a_{k-1} x^{k-1} \oplus \cdots \oplus a_1 \times \oplus a_0) x^m \bmod G(x)$$

$$= (((\cdots ((a_k \times \oplus a_{k-1}) \times \oplus a_{k-2}) \times \oplus \cdots)$$

$$\times \oplus a_1) \times \oplus a_0) x^m \bmod G(x) \cdots (3)$$

When the $a_i$'s are grouped in groups of w (i.e., the processor data width) or an integral multiple of w, equation (3) becomes:

$$C(x) = [(\cdots (\cdots (a_k x^{w-1} \oplus a_{k-1} x^{w-2} \oplus \cdots \oplus$$

$$a_{k-w-1})x^w \oplus \cdots)x^w \oplus \cdots \oplus (a_{k_w} x^{w-1} \oplus a_{k_w-1} x^{w-2} \oplus \cdots \oplus$$

$$a_1 x^{w-k_w} \oplus a_0 x^{w-k_w-1})]x^{m+k_w+1-w} \bmod G(x) \cdots (4) \text{ where}$$

$$k_w = k \pmod{w}$$

Equation (4) is the bit parallel approach of encoding residue calculation. The decoding syndrome calculation is similar except that the length of the bit stream is increased by the number of check bits (i.e., k←k+m).

The general form of equation (4) is very difficult to recognize. Therefore, it's rewritten for the Sperry Univac 90/30 Disk Storage Fire code as follows:
Degree of the generator polynomial m=24
Number of information bit k+1=2135
Processor data width w=32
$k_w = 22$, $(k+m)_2 = 14$.

$$C(x) = (a_{2134} x^{2134} \oplus a_{2133} x^{2133} \oplus \cdots \oplus \cdots \oplus a_3 x^3 \oplus a_2 x^2 \oplus$$

$$a_1 \times \oplus a_0) x^{24} \bmod G(x)$$

$$= \{(\cdots [(a_{2134} x^{31} \oplus a_{2133} x^{30} \oplus \cdots a_{2103}) x^{32} \oplus \cdots ]x^{32} \oplus$$

$$\cdots )x^{32} \oplus a_{22} x^{31} \oplus a_{21} x^{30} \oplus \cdots \oplus a_0 x^9\} x^{15}$$

$$S(x) = (a_{2158} x^{2158} \oplus a_{2157} x^{2157} \oplus \cdots \oplus a_1 x + a_0) x^{24} \bmod G(x)$$

$$= \{(\cdots [(a_{2158} x^{31} \oplus a_{2157} x^{30} \oplus \cdots \oplus a_{2127}) x^{32} \oplus$$

$$a_{2126} x^{31} \oplus a_{2125} x^{30} \oplus \cdots \oplus a_{2095}) x^{32} \oplus \cdots ]x^{32} \oplus a_{14} x^{31} \oplus$$

$$a_{13} x^{30} \oplus \cdots \oplus a_1 x^{18} \oplus a_0 x^{17}\} x^7 \bmod G(x)$$

The detailed steps for calculating the residue by equation (4) are:
(A) Clear the accumulator
(B) Load the highest order w information bits into accumulator
(C) Multiply the content of accumulator by $x^w$ modulo G(x)
(D) Add (modulo 2) the next highest order w bits to the contents of the accumulator
(E) If end of record, step; otherwise go to step C
(F) Multiply the contents of the accumulator by $x^{k_w+1}$ result is in modulo G(x).

Obviously, step C above can be implemented either by w continuous shift-add operations or by one or more steps of a table look-up procedure. The one step table look-up requires a memory size of $W \times 2^w$ bits which can be prohibitively large. The required memory size for an n step table look-up procedure is $2^{w/n}$ words by w bits.

B. Error decoding

Emulation of the shift register error trapping process is rather straight forward. However, it can be excessively time consuming for a long data block, and it becomes necessary to employ the multi-syndrome decoding algorithm.

Error correction

The Bit parallel error correction by an exclusive or operation in the processor is an evident process once the error pattern and error location are obtained.

In summary, this invention deals with parallel processing of cyclic code encoding and decoding.

The advantages are:
(1) High speed on-line residue generation
(2) It allows the choice of an optimum code because the code implementation can easily be changed by changing the content of the look up table.

The foregoing has described a high speed code processing for error correcting code which utilizes bit parallel residue generation for cyclic codes.

It is anticipated that aspects of the present invention, other then those specifically defined in the appended claims, can be obtained from the foregoing description and the drawings.

Having thus described the invention, what is claimed is:

1. A high speed code processing system for error correcting code comprising:
    an encoding/decoding apparatus;
    clocking means connected to and operative upon said encoding/decoding apparatus;
    means for supplying a string of information bits I (x) to said encoding/decoding apparatus;
    means further associated with said encoding/decoding apparatus for enabling encoding/decoding said information in multiple bit segments during a single clock time of said clocking means whereby said encoding/decoding time is substantially reduced;
    said encoding/decoding apparatus including further means for producing and storing a plurality of check bits m;
    said multiple bit segment being equal to a number of bits w taken in parallel at each clock cycle to thereby reduce the number of clock cycles required for encoding/decoding by a factor w; and
    said bits w being equal to said bits m.

* * * * *